(12) United States Patent
Setz et al.

(10) Patent No.: US 9,748,523 B2
(45) Date of Patent: *Aug. 29, 2017

(54) ORGANIC LIGHT-EMITTING DEVICE

(71) Applicant: OSRAM OLED GmbH, Regensburg (DE)

(72) Inventors: Daniel Steffen Setz, Böblingen (DE); Thilo Reusch, Regensburg (DE); Nina Riegel, Tegernheim (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 15/096,606

(22) Filed: Apr. 12, 2016

(65) Prior Publication Data

US 2016/0226028 A1 Aug. 4, 2016

Related U.S. Application Data

(63) Continuation of application No. 14/354,897, filed as application No. PCT/EP2012/072230 on Nov. 9, 2012, now Pat. No. 9,343,704.

(30) Foreign Application Priority Data

Nov. 11, 2011 (DE) .................. 10 2011 086 168

(51) Int. Cl.
*H01L 33/00* (2010.01)
*H01L 51/52* (2006.01)
(Continued)

(52) U.S. Cl.
CPC ........ *H01L 51/5268* (2013.01); *H01L 51/004* (2013.01); *H01L 51/0035* (2013.01);
(Continued)

(58) Field of Classification Search
CPC ... H01L 27/32–27/326; H01L 51/50–51/5012; H01L 51/525–51/5287;
(Continued)

(56) References Cited

U.S. PATENT DOCUMENTS 6,572,961 B1 6/2003 Koyama et al.
7,999,283 B2 8/2011 Chakraborty et al.
(Continued)

FOREIGN PATENT DOCUMENTS

CN 101790798 A 7/2010
DE 102008048161 A1 6/2010
(Continued)

OTHER PUBLICATIONS

Do, et al, "Enhanced Light Extraction from Organic Light-Emitting Diodes with 2D SiO2/SiNx Photonic Crystals," Advanced Material, WILEY-VCH Verlag GmbH & Co. KGaA, vol. 15, No. 14, Jul. 17, 2003, pp. 1214-1218.
(Continued)

*Primary Examiner* — Cuong B Nguyen
(74) *Attorney, Agent, or Firm* — Slater Matsil, LLP

(57) ABSTRACT

An organic light-emitting device includes a substrate, on which a transparent electrode and a further electrode are applied. An organic light-emitting layer is arranged between the electrodes. At least one optical scattering layer is arranged on a side of the transparent electrode facing away from the organic light-emitting layer.

14 Claims, 4 Drawing Sheets

(51) Int. Cl.
*H01L 51/00* (2006.01)
*H01L 51/56* (2006.01)
*H01L 27/32* (2006.01)

(52) U.S. Cl.
CPC ...... *H01L 51/5206* (2013.01); *H01L 51/5253* (2013.01); *H01L 51/56* (2013.01); *H01L 27/3239* (2013.01); *H01L 2251/301* (2013.01); *H01L 2251/303* (2013.01); *H01L 2251/558* (2013.01)

(58) Field of Classification Search
CPC .............. H01L 2227/32–2227/326; H01L 2251/5323–2251/5361; H01L 2924/12044; H01L 51/004; H01L 51/56; H01L 51/0035; H01L 51/5206; H01L 2251/301; H01L 2251/303; H01L 27/03
See application file for complete search history.

(56) References Cited

U.S. PATENT DOCUMENTS

| 9,343,704 | B2* | 5/2016 | Setz | ............. H01L 51/5268 |
| 2003/0127973 | A1 | 7/2003 | Weaver et al. | |
| 2007/0177380 | A1 | 8/2007 | Schultz et al. | |
| 2007/0257608 | A1 | 11/2007 | Tyan et al. | |
| 2012/0091923 | A1 | 4/2012 | Kastner-Jung et al. | |
| 2012/0193645 | A1 | 8/2012 | Krummacher et al. | |

FOREIGN PATENT DOCUMENTS

| DE | 102009025123 A1 | 12/2010 |
| DE | 102009036134 A1 | 2/2011 |
| EP | 2224788 A1 | 9/2010 |
| EP | 2278852 A1 | 1/2011 |
| JP | 2010171349 A | 8/2010 |
| WO | 03061028 A2 | 7/2003 |
| WO | 2007089599 A2 | 8/2007 |
| WO | 2010066245 A1 | 6/2010 |
| WO | 2010095514 A1 | 8/2010 |
| WO | 2011078915 A1 | 6/2011 |

OTHER PUBLICATIONS

Sun, et al., "Enhanced light out-coupling of organic light-emitting devices using embedded low-index grids," Nature Photonics, vol. 2, Macmillan Publishers Limited, Aug. 2008, pp. 483-487.

Ziebarth, et al., "Extracting Light from Polymer Light-Emitting Diodes Using Stamped Bragg Gratings," Advanced Functional Materials, WILEY-VCH Verlag GmbH & Co. KGaA, vol. 14, No. 5, May 2004, pp. 451-456.

* cited by examiner

ORGANIC LIGHT-EMITTING DEVICE

This application is a continuation application of U.S. application Ser. No. 14/354,897, filed on Apr. 28, 2014, which is a national phase under section 371 of PCT/EP2012/072230, filed Nov. 9, 2012, which claims the priority of German patent application 10 2011 086 168.8, filed Nov. 11, 2011, each of which is incorporated herein by reference in its entirety.

TECHNICAL FIELD

An organic light-emitting device is provided.

BACKGROUND

In the case of conventional organic light-emitting diodes (OLEDs), only some of the generated light is directly coupled out. The rest of the light generated in the active region is distributed to various loss channels, for instance in light which is guided in the substrate, in a transparent electrode and in organic layers by means of wave guide effects, and in surface plasmons which can be generated in a metallic electrode. The wave guide effects occur in particular by reason of the differences in the refractive index at the boundary surfaces between the individual layers and regions of an OLED. In particular, the light which is guided in the loss channels cannot be coupled out from an OLED without additional technical measures.

In order to increase the coupling-out of light and thus the radiated light power, measures are known in order to couple out the light, which is guided in a substrate, into radiated light. For this purpose, films having scatter particles or films having surface structures, such as microlenses, are used, e.g., on the substrate outer side. It is also known to provide direct structuring of the substrate outer side or to introduce scatter particles into the substrate. Some of these approaches, e.g., the use of scattering films, are already used commercially and can be scaled up in particular in the case of OLEDs, which are designed as illumination modules, in relation to the radiating surface. However, these approaches for coupling out light have the significant disadvantages that the coupling-out efficiency is limited to about 60% to 70% of the light guided in the substrate and that the appearance of the OLED is significantly influenced, as a milky, diffusely reflecting surface is produced by the applied layers or films.

Approaches are also known for coupling out the light which is guided in organic layers or in a transparent electrode. However, these approaches have hitherto not become established in a commercial sense in OLED products. For example, the document Y. Sun, S. R. Forrest, Nature Photonics 2,483 (2008) proposes the formation of so-called "low-index grids", wherein structured regions having a material with a low refractive index are applied onto a transparent electrode. Furthermore, it is also known to apply highly refractive scattering regions under a transparent electrode in a polymeric matrix, as described, e.g., in U.S. patent application 2007/0257608. In this case, the polymeric matrix generally has a refractive index in the region of 1.5 and is applied using wet chemistry. Furthermore, so-called Bragg grids or photonic crystals having periodic scattering structures with structure sizes in the wavelength range of the light are also known, as described, e.g., in the documents Ziebarth et al., Adv. Funct. Mat. 14, 451 (2004) and Do et al., Adv. Mat. 15, 1214 (2003).

OLEDs having a large luminous surface often encounter the problem of light density inhomogeneity as the distance from electrical contacts increases. This problem can be improved by using current-conducting structures, so-called "bus bars" within the active luminous surface. However, structures such as these are visible in the light-emitting pattern of an OLED and for this reason are undesirable.

SUMMARY OF THE INVENTION

At least one example of specific embodiments is to provide an organic light-emitting device.

In accordance with at least one embodiment, an organic light-emitting device has on a substrate a transparent electrode and a further electrode, between which an organic functional layer stack is arranged. The organic functional layer stack has an organic light-emitting, electroluminescent layer. The organic light-emitting device can be formed in particular as an organic light-emitting diode (OLED).

The organic functional layer stack can have layers comprising organic polymers, organic oligomers, organic monomers, organic, small, non-polymeric molecules ("small molecules") or combinations thereof. In particular, it can be advantageous if the organic functional layer stack has a functional layer which is designed as a hole transport layer, in order to permit effective hole injection into the light-emitting layer. For example, tertiary amines, carbazole derivatives, conductive polyaniline or polyethylene dioxythiophene can prove to be advantageous as materials for a hole transport layer. Materials which have radiation emission by reason of fluorescence or phosphorescence, e.g., polyfluorene, polythiophene or polyphenylene or derivatives, compounds, mixtures or copolymers thereof, are suitable as materials for the light-emitting layer. Furthermore, the organic functional layer stack can have a functional layer which is formed as an electron transport layer. Furthermore, the layer stack can also have electron and/or hole blocking layers. The organic functional layer stack can also have a plurality of organic light-emitting layers which are arranged between the electrodes.

With regard to the basic structure of an organic light-emitting device, e.g., with regard to the structure, the layer composition and the materials of the organic functional layer stack, reference is made to International patent publication WO 2010/066245 A1 which is hereby expressly incorporated by reference in particular in relation to the structure of an organic light-emitting device.

The electrodes can each be formed over a large area. This permits large-area radiation of the electromagnetic radiation generated in the organic light-emitting layer. The term "large-area" can mean that the organic light-emitting device has an area of greater than or equal to several square millimeters, preferably greater than or equal to one square centimeter and particularly preferably greater than or equal to one square decimeter.

Furthermore, an encapsulation arrangement can also be arranged above the electrodes and the organic functional layer stack. The encapsulation arrangement can be designed preferably in the form of a thin-layer encapsulation.

In the present case, an encapsulation arrangement formed as a thin-layer encapsulation is understood to be an apparatus which is suitable for forming a barrier against atmospheric substances, in particular against moisture and oxygen and/or against further damaging substances such as corrosive gases, e.g., hydrogen sulphide. In other words, the thin-layer encapsulation is formed in such a manner that at the most only very small quantities of atmospheric substances can penetrate it. In the case of the thin-layer encapsulation, this barrier effect is produced substantially by barrier layers and/or passivation layers which are designed as thin layers and form part of the encapsulation arrangement. The layers of the encapsulation arrangement generally have a thickness of less than or equal to a few 100 nm.

In particular, the thin-layer encapsulation can comprise or consist of thin layers which are responsible for the barrier effect of the encapsulation arrangement. The thin layers can be applied, e.g., by an atomic layer deposition (ALD) process. Suitable materials for the layers of the encapsulation arrangement are, e.g., aluminum oxide, zinc oxide, zirconium oxide, titanium oxide, hafnium oxide, lanthanum oxide and tantalum oxide. Preferably, the encapsulation arrangement has a layer sequence having a plurality of thin layers which each have a thickness between one atom layer and 10 nm inclusive.

Alternatively or in addition to thin layers produced by ALD, the encapsulation arrangement can have at least one or a plurality of further layers, i.e., in particular barrier layers and/or passivation layers which are deposited by thermal vapor deposition or by a plasma-assisted process, such as sputtering or plasma-enhanced chemical vapor deposition (PECVD). Suitable materials for this can be the aforementioned materials, and silicon nitride, silicon oxide, silicon oxynitride, indium oxide, indium tin oxide, indium zinc oxide, aluminum-doped zinc oxide, aluminum oxide and mixtures and alloys of said materials. The one or plurality of further layers can have, e.g., in each case a thickness between 1 nm and 5 µm and preferably between 1 nm and 400 nm inclusive.

In accordance with a further embodiment, the substrate comprises one or a plurality of materials in the form of a layer, a plate, a film or a laminate which are selected from glass, quartz, synthetic material, metal and silicon wafer. In a particularly preferred manner, the substrate comprises, or is made from, glass, e.g., in the form of a glass layer, glass film or glass plate.

In accordance with a further embodiment, the substrate is formed in a transparent manner and the transparent electrode is arranged between the substrate and the organic light-emitting layer, so that light generated in the light-emitting layer can be radiated through the transparent electrode and the substrate. This type of organic light-emitting device can also be defined as a so-called "bottom emitter".

In accordance with a further embodiment, a cover layer is arranged, as seen from the substrate, on the organic functional layer stack and the electrodes, so that the electrodes and the organic functional layer stack are arranged with the organic light-emitting layer between the substrate and the cover layer. The cover layer can also be defined as a "superstrate" in terms of its arrangement in comparison with the substrate.

In accordance with a further embodiment, the cover layer is formed in a transparent manner and the transparent electrode is arranged between the organic light-emitting layer and the cover layer, so that light generated in the light-emitting layer can be radiated through the transparent electrode and the cover layer. This type of organic light-emitting device can also be defined as a so-called "top emitter". The further electrode which is arranged on the side of the organic functional layer stack facing towards the substrate is designed in a reflective manner for an organic light-emitting device formed as a "top emitter".

The cover layer can comprise, e.g., one or a plurality of the materials previously described in connection with the substrate. In a particularly preferred manner, the cover layer comprises a glass layer, glass film or glass plate.

The cover layer can have encapsulating properties and can be part of an encapsulation arrangement or can be formed as an encapsulation arrangement. Furthermore, it is also possible for the cover layer to be applied only as mechanical protection, e.g., as scratch-protection. The organic light-emitting device can comprise, in addition to the cover plate, an above-described encapsulation arrangement, in particular a thin-layer encapsulation, above which, as seen from the substrate, the cover layer is arranged.

In accordance with a further embodiment, at least one optical scattering layer is arranged on a side of the transparent electrode facing away from the organic light-emitting layer.

In accordance with a further embodiment, the at least one optical scattering layer is arranged between the transparent electrode and the substrate which is formed in a transparent manner.

In accordance with a further embodiment, the at least one optical scattering layer is arranged on a side of the substrate which faces away from the transparent electrode and is formed in a transparent manner.

In accordance with a further embodiment, the at least one optical scattering layer is arranged between the transparent electrode and the cover layer which is formed in a transparent manner.

In accordance with a further embodiment, the at least one optical scattering layer is arranged on a side of the cover layer which faces away from the transparent electrode and is formed in a transparent manner.

It is also possible for the organic light-emitting device to have a plurality of optical scattering layers in accordance with combinations of the aforementioned embodiments.

In comparison with a material which is defined as a normally refractive material and has a refractive index of 1.5, the scattering layer can have a material which is defined in this case as a more highly refractive material and has a refractive index in a region of greater than or equal to about 1.6 and less than or equal to about 1.7 to 1.8, or can have a material which is defined in this case as a highly refractive material and has a refractive index of greater than 1.8. The refractive indices described here and hereinafter apply for a wavelength of, e.g., 600 nm. For other wavelengths, a stated refractive index value can also change by reason of material dispersion.

Furthermore, the scattering layer can comprise, or can be formed from, a matrix material and scatter particles, wherein the scatter particles preferably have a refractive index which is different from the matrix material. In the case of a scattering layer having a matrix material and scatter particles, the refractive indices of the scattering layer as described above and hereinafter relate to the matrix material.

By means of the at least one optical scattering layer which, as seen from the organic light-emitting layer, is arranged on the opposite side of the transparent electrode, the coupling-out of light from the organic light-emitting device can be effected by a reduction in that proportion of light which is guided in the layers of the device by wave guide effects. Furthermore, it can also be possible to achieve an improvement in the luminous density homogeneity and a reduction in the luminous density inhomogeneity. It can thereby also be possible, in particular in the case of a scattering layer arranged on the side of the substrate or the cover layer facing away from the transparent electrode, to compensate for process fluctuations in relation to luminous density inhomogeneity and/or the emission color by means of targeted adaptation of the scattering layer.

The scattering effect of the at least one scattering layer can be influenced, e.g., by varying the concentration of the scatter particles in the matrix material. Furthermore, the scattering effect can also be influenced by varying the number of scatter particles on the active surface of the organic light-emitting device. In particular, the scattering layer can have, e.g., a varying thickness and/or a varying concentration of the scatter particles in the matrix material, so that the scattering effect can be influenced in the entire film and also inside the film by means of which the at least one optical scattering layer is formed. By changing the scattering effect in a targeted manner within the optical scattering layer, e.g., a continuous progression of the scattering effect can be achieved. The light is thereby coupled out more effectively at certain, intended locations, whereby, e.g., luminous density inhomogeneities can be compensated for in a targeted manner. Furthermore, it is also possible to provide only individual regions with a scattering effect or to provide individual regions with a stronger scattering effect than other regions, whereby effects such as the display of writing or symbols such as pictograms becomes possible by means of intentionally increased inhomogeneities or other structured luminous impressions within the luminous image, i.e., on the active surface. More light is thereby radiated from the regions in which the scattering effect is higher than from regions in which the scattering effect is lower or which have no scattering effect.

Therefore, by means of a scattering layer which has a varying arrangement of scatter particles, depending upon the arrangement of the scatter particles it is possible to achieve either a homogenization of the luminous image or even a target inhomogeneity of the luminous image. For example, one of the electrodes or both electrodes can each be electrically contacted by a contact element which is arranged preferably at the edge of the active surface. By reason of the material and/or the thickness of the respective electrode, a voltage drop can be present along the electrode as the distance from the contact element increases, whereby the number of charge carriers which are injected into the organic functional layer stack can decrease as the distance to the contact element increases. In order to compensate for the corresponding decrease in the luminous density as the distance from the contact element increases, the scatter particles in the at least one optical scattering layer can have a concentration which increases as the distance from the contact element increases.

The at least one optical scattering layer can be applied, e.g., as self-supporting film, in particular on the side of the substrate or cover layer facing away from the transparent electrode. A self-supporting layer is defined here and hereinafter as a layer which is produced separately prior to the arrangement on the substrate or cover layer. Furthermore, it is also possible to lay the at least one scattering layer as described above "inwardly" and to arrange it at that location, i.e., for a top emitter, e.g., between a thin-film encapsulation and the cover layer which can be formed by a cover glass, for bottom emitters, between the substrate and the transparent electrode. Depending upon the material of the scattering layer, it may be necessary in particular in the case of such internal scattering layers to arrange, between the scattering layer and the transparent electrode, a further barrier in addition to the encapsulation arrangement which is formed, e.g., by a further thin-film encapsulation described above. In particular, in the case of materials for the optical scattering layer which are applied from the liquid phase, it can be particularly advantageous to arrange such a barrier or encapsulation layer between the scattering layer and the transparent electrode.

In the case of layers which are processed in a non-liquid manner as described further below, e.g., consisting of inorganic materials, it can also be possible that no such additional barrier is required, e.g., in the case of a scattering layer which has a highly refractive material consisting of glass, an oxide or a nitride which themselves normally have a barrier effect.

An external scattering layer defines here and hereinafter an optical scattering layer which is arranged on the side of the substrate or cover layer facing away from the transparent electrode, whereas an optical scattering layer defined as an internal scattering layer is arranged between the transparent electrode and the substrate or between the transparent electrode and the cover layer.

Depending on whether the scattering layer is arranged on the inside or outside, various materials from different refractive index ranges have proven to be particularly advantageous. If the scattering layer is applied externally on the substrate or cover layer, the scattering layer can preferably have a refractive index in the region of about 1.5, i.e., a normally refractive material. In particular, in this case the following polymers have proven to be advantageous as the matrix material: polycarbonate, polyethylene naphthalate, polyethylene terephthalate, polyurethane and an acrylate such as polymethyl methacrylate. The scatter particles preferably comprise a material which has a refractive index different from the matrix material, e.g., the scatter particles can comprise aluminum oxide, titanium oxide, zirconium oxide, silicon oxide and/or pores. Pores are defined here and hereinafter as cavities which, e.g., can be filled with gas, i.e., filled with air.

In the case of an internal scattering layer, the matrix material used can be same as for an external scattering layer. Furthermore, an internal scattering layer can also comprise the aforementioned scatter particle materials or scatter particle embodiments.

In particular, an internal scattering layer can have a refractive index which is at least equal to and preferably greater than a layer thickness-weighted average refractive index of the layers of the organic functional layer stack. In the case of internal scattering layer, the use of more highly refractive or highly refractive materials can be particularly advantageous, as the coupling-out of light can be increased still further as a result. For example, the scattering layer can comprise a matrix material in the form of a highly refractive layer which is applied from the liquid phase and which comprises a polymer having metal oxides distributed therein, such as are available, e.g., from the company BrewerScience under the designation OptiNDEX-series. Furthermore, in addition to or as an alternative to the aforementioned normally refractive polymers, the scattering layer can also comprise, e.g., an epoxide as the matrix material.

Furthermore, in order to increase the refractive index of the matrix material, an additive can be contained therein which consists of a more highly refractive material, e.g., a metal oxide such as titanium dioxide. The additive is present preferably in the form of nanoparticles which have a size of less than 50 nm. Nanoparticles of such a size which is in a range considerably lower than the wavelength of the light generated in the organic light-emitting layer do not act as individual scatter particles in particular for visible light.

Furthermore, it is also possible that the scattering layer comprises a sol-gel material having a refractive index of greater than 1.8 and/or an inorganic material having a refractive index of greater than 1.8. Such an inorganic material can be formed, e.g., by a highly refractive glass or by a highly refractive oxide or nitride, e.g., titanium dioxide, silicon nitride, tantalum oxide or zirconium oxide.

In accordance with a further embodiment, the scatter particles have a size of greater than or equal to 200 nm and less than or equal to 5000 nm. Such scatter particles can achieve a scattering effect by being introduced into the matrix material having a refractive index different from the scatter particles. The scatter particles can thereby have a higher or lower refractive index than the matrix material. Highly refractive scatter particles can comprise, e.g., titanium dioxide or zirconium dioxide, whereas low-refractive scatter particles can comprises, e.g., silicon dioxide or can be formed by pores. It is particularly advantageous if the refractive indices of the matrix material and of the scatter particles as well as the concentration of the scatter particles are selected such that the scattering effect ("haze") of the entire scattering layer is not less than 20%.

In accordance with a further embodiment, the scattering layer can be applied, e.g., by porous printing, screen printing, spin-coating or spray-coating. It is thereby also possible to produce, e.g., a gradient in the scattering effect by a varying number or concentration of the scatter particles. A linear gradient can be achieved, e.g., by varying the thickness of the scattering layer by lowering the doctor blade in a printing process. A radial concentration gradient of the scatter particles can be achieved, e.g., by spin-coating and by means of the effective centrifugal forces. Any gradient can, e.g., also be produced by printing processes. For example, points of the wet scattering layer can be printed on with a different density for each surface, which flow into one another through a temperature film and produce a continuous scattering film or a continuous scattering layer having a different layer thickness. Furthermore, it is also possible to achieve any concentration gradient of the scatter particles, in that, e.g., the matrix material is applied in a uniform film and a laterally varying density of scatter particles is applied thereon. The scatter particles can thereby be applied, e.g., by printing, for instance inkjet printing, or spraying. After being applied, the scatter particles sink into the matrix material and produce laterally different scattering effects by reason of their laterally varying density.

In accordance with a further embodiment, the scattering layer comprises at least one additive which is UV-absorbent. As a result, the organic layers of the organically functional layer stack can be protected against UV radiation. For this purpose, the additive can comprise, e.g., titanium dioxide or an organic material which absorbs UV radiation, e.g., one or a plurality of the following materials: 2-hydroxybenzophenone, 2-hydroxyphenyl benzotriazole, salicylic acid ester, cinnamic acid ester derivative, resorcinol monobenzoate, oxalic acid anilide, p-hydroxybenzoic acid ester.

In accordance with a further embodiment, the scattering layer comprises at least one additive which has a high thermal conductivity, in particular a thermal conductivity which is greater than the thermal conductivity of the matrix material. For this purpose, the additive can comprise e.g. particles having one or a plurality of the following materials: aluminum nitride, silicon carbide and magnesium oxide. These materials can have a thermal conductivity of up to 590 W/mK.

In accordance with a further embodiment, the transparent electrode comprises or consists of a transparent conductive oxide. Transparent conductive oxides (TCO) are transparent, conductive materials, generally metal oxides such as, e.g., zinc oxide, tin oxide, cadmium oxide, titanium oxide, indium oxide or indium tin oxide (ITO). In addition to binary metal oxygen compounds, such as, e.g., $ZnO$, $SnO_2$ or $In_2O_3$, ternary metal oxygen compounds, such as, e.g., $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of different transparent conductive oxides also belong to the group of TCOs. Furthermore, the TCOs do not necessarily correspond to a stoichiometric composition and can also be p-doped or n-doped.

In accordance with a further embodiment, the transparent electrode comprises or is made from ITO, ZnO and/or $SnO_2$. In particular, the transparent electrode can have a thickness of greater than or equal to 50 nm and less than or equal to 200 nm.

Furthermore, it is possible for the transparent electrode to comprise a transparent metal oxide, applied from a solution.

Furthermore, the transparent electrode can comprise a metal layer or a metal film having a metal or an alloy, e.g., having one or a plurality of the following materials: Ag, Pt, Au, Mg, Ag:Mg.

In accordance with a further embodiment, the transparent electrode is formed as a so-called percolation electrode and in particular as a so-called percolation anode. A percolation electrode can preferably comprise or be made from the following materials: metallic nano wires, e.g., having or consisting of Ag, Ir, Au, Cu, Cr, Pd, Pt or a combination thereof; semiconducting nano wires, e.g. having or consisting of InAs and/or Si which furthermore can also be doped; graphene or graphene particles; carbon nanotubes.

In accordance with a further embodiment, the transparent electrode comprises one or a plurality of the aforementioned materials in combination with a conductive polymer, e.g., poly-3,4-ethylenedioxythiophene (PEDOT) and/or polyaniline (PANI) and/or with a transition metal oxide and/or in the case of a metallic transparent electrode or a percolation electrode having a transparent conductive oxide applied from the liquid phase.

In a preferred embodiment, the transparent electrode is formed as an anode and comprises one or a plurality of the aforementioned materials. The further electrode is then formed as a cathode.

In accordance with a further embodiment, the further electrode is formed in a reflective manner and comprises, e.g., a metal which can be selected from aluminum, barium, indium, silver, gold, magnesium, calcium and lithium as well as compounds, combinations and alloys thereof. In particular, the reflective further electrode can comprise Ag, Al or alloys therewith, e.g., Ag:Mg, Ag:Ca and Mg:Al. The reflective electrode can be formed in particular as a cathode. Alternatively or in addition, the reflective electrode can also comprise one of the aforementioned TCO materials.

In accordance with a further embodiment, the further electrode is also transparent. The transparent further electrode can comprise features and materials, as described in connection with the transparent electrode. In particular, the organic light-emitting device can be formed with two transparent electrodes as a translucent OLED which can radiate light on both sides. At least two scattering layers can also be arranged on different sides of the organic light-emitting layer. In particular, embodiments previously described in the case of an OLED which emits on both sides can be combined in relation to the at least one scattering layer on the substrate side and on the side of the cover layer.

In the case of the organic light-emitting device described in this case, the at least one optical scattering layer in accordance with the previously described embodiments renders it possible to achieve an increase in efficiency and a luminous density homogenization in comparison with OLEDs without such an additional scattering layer.

BRIEF DESCRIPTION OF THE DRAWINGS

Further advantages, advantageous embodiments and developments will be apparent from the exemplified embodiments described hereinafter in conjunction with the figures, in which.

Figure 1A:
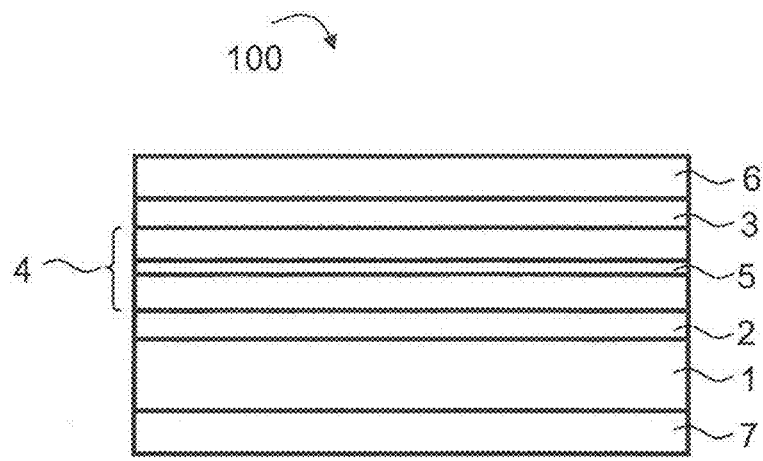
FIGS. 1A to 1D show schematic views of organic light-emitting devices in accordance with several exemplified embodiments.

In the exemplified embodiments and figures, like elements, or elements acting in a similar or identical manner, can be provided with the same reference numerals in each case. The illustrated elements and the size ratios of the elements with respect to each other are not to be regarded as being to scale. Rather, individual elements, such as, e.g., layers, components, devices and regions, may be illustrated excessively large to provide a clearer illustration and/or for ease of understanding.

DETAILED DESCRIPTION OF ILLUSTRATIVE EMBODIMENTS

FIGS. 1A to 1D show various exemplified embodiments for organic light-emitting devices 100, 101, 102, 103.

In the case of all of these exemplified embodiments, the organic light-emitting devices 100, 101, 102, 103 comprise a substrate 1, on which an organic functional layer stack 4 having an organic light-emitting layer 5 is arranged between a transparent electrode 2 and a further electrode 3. Arranged thereabove is an encapsulation arrangement 6 for protecting the organic layers. The encapsulation arrangement 6 is designed in a particularly preferable manner as a thin-layer encapsulation as described in the general part.

Figure 1B:
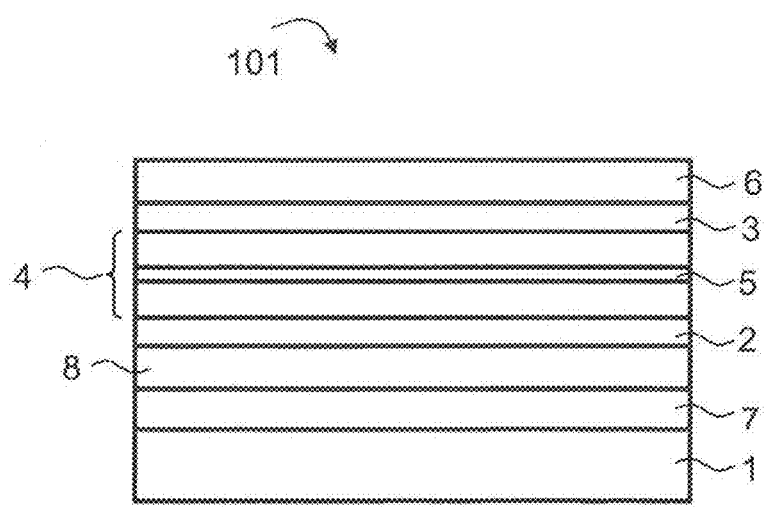

In the exemplified embodiments of FIGS. 1A and 1B, the substrate 1 is transparent in each case, e.g., in the form of a glass plate or glass layer. Applied to this glass plate or glass layer is the transparent electrode 2 which comprises, e.g., a transparent conductive oxide, a transparent metal oxide or another material—stated above in the general part—for the transparent electrode or combinations thereof. In particular, the transparent electrode 2 is formed as an anode in the illustrated exemplified embodiments. The organic light-emitting devices 100, 101 are thus designed as bottom emitters and in operation radiate light through the transparent electrode 2 and the transparent substrate 1.

In the illustrated exemplified embodiments, the further electrode 3 is formed in a reflective manner and comprises in particular a metal mentioned above in the general part. The organic functional layer stack 4 having the organic light-emitting layer comprises, e.g., a hole injection layer, a hole transport layer, an electron blocking layer, a hole blocking layer, an electron transport layer and/or an electron injection layer which are suitable for conducting holes or electrons to the organic light-emitting layer 5 or for blocking the respective transport. Suitable layer structures for the organic functional layer stack 4 are known to the person skilled in the art and are therefore not described further here.

In the exemplified embodiment in accordance with FIG. 1A, the organic light-emitting device 100 comprises an optical scattering layer 7 on the side of the substrate 1 facing away from the transparent electrode 2. The external scattering layer 7 comprises a normally refractive material having a refractive index in the region of about 1.5, e.g., a polymer material such as polymethyl methacrylate, polycarbonate, polyethylene naphthalate, polyethylene terephthalate, polyurethane or a combination thereof which forms a matrix material of the scattering layer 7. By means of such a material, the coupling-out of light guided in the substrate 1 by wave guide effects can be achieved by reducing the total reflection at the boundary surface between the substrate 1 and the scattering layer 7. Furthermore, the scattering layer 7 comprises scatter particles in the matrix material which have a refractive index different from the matrix material, as described further below.

The organic light-emitting device 101 in accordance with the exemplified embodiment in FIG. 1B comprises, in comparison with the exemplified embodiment of FIG. 1A, a so-called internal scattering layer 7, i.e., a scattering layer 7 which is arranged between the substrate 1 and the transparent electrode 2. The scattering layer 7 can comprise the same materials as the scattering layer 7 in accordance with the exemplified embodiment of FIG. 1A. However, in a particularly preferred manner the scattering layer 7 in the exemplified embodiment in accordance with FIG. 1B comprises a more highly refractive or highly refractive matrix material, as described above in the general part. For example, the scattering layer 7 can also comprise an epoxide in addition or as an alternative to the aforementioned polymers. Alternatively or in addition, the scattering layer 7 can comprise as the matrix material a highly refractive polymer which is available, e.g., from the company BrewerScience under the designation OptiNDEX.

Furthermore, the matrix material can comprise an additive for adapting and in particular for increasing the refractive index, such as, e.g., titanium oxide nanoparticles having a size of less than 50 nm. Furthermore, the scattering layer 7 in FIG. 1B can comprise a sol-gel matrix material having a refractive index of greater than 1.8. It is also possible for the scattering layer 7 to comprise an inorganic matrix material, e.g., a highly refractive glass or oxide or nitride, such as titanium oxide, silicon nitride, tantalum oxide or zirconium oxide.

For materials for the scattering layer 7 which are applied from the liquid phase, an additional encapsulation layer, e.g., in the form of a thin-layer encapsulation 8, can be arranged, as shown in FIG. 1B, between the scattering layer 7 and the transparent electrode 2, in order to protect the organic layers of the organic functional layer stack 4 against the ingress of damaging substances through the scattering layer 7.

Figure 1C:
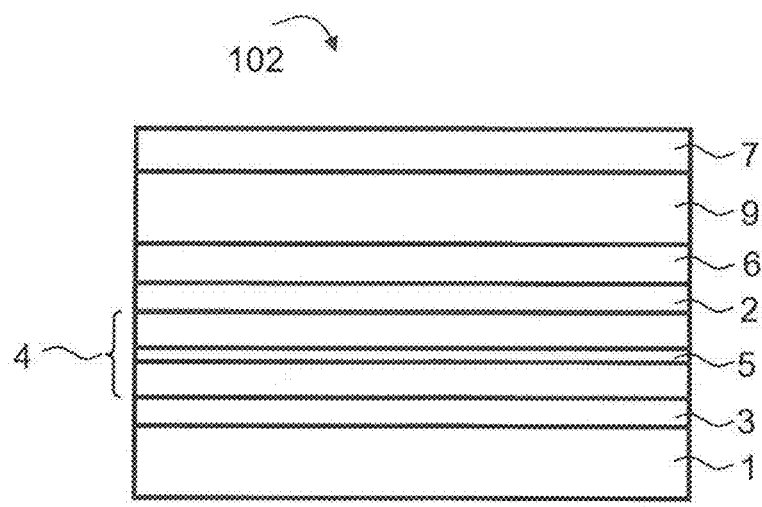
Figure 1D:
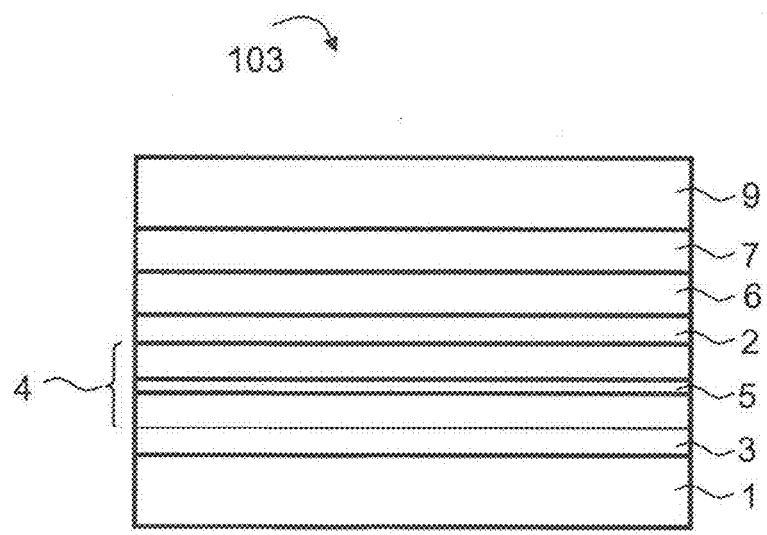

The organic light-emitting devices 102 and 103 in accordance with the exemplified embodiments of FIGS. 1C and 1D are formed as so-called top emitters, in which the scattering layer 7 is arranged on the side of the organic light-emitting layer 5 facing away from the substrate 1.

In FIG. 1C, the scattering layer 7 is arranged as an external layer on a cover layer 9 which, as seen from the substrate 1, is arranged above the organic functional layer stack 4. The cover layer 9 is formed in a transparent manner, e.g., in the form of a glass layer or a glass plate which can be formed as an encapsulation or even as scratch-protection. Furthermore, the transparent electrode 2 is arranged between the light-emitting layer 5 and the cover layer 9, so that the light generated in the organic light-emitting layer 5 can be radiated through the transparent electrode 2, the encapsulation arrangement 6, the cover layer 9 and the external scattering layer 7 arranged thereabove.

The organic light-emitting device 103 in accordance with the exemplified embodiment of FIG. 1D comprises, in comparison with the exemplified embodiment of FIG. 1C, an internal scattering layer 7 between the cover layer 9 and the transparent electrode 2 and in particular between the cover layer 9 and the encapsulation arrangement 6.

The scattering layer 7 in the exemplified embodiments in accordance with FIGS. 1C and 1D can comprise materials, as described for the scattering layers 7 of FIGS. 1A and 1B.

The scattering effect of the scattering layer 7 in the illustrated exemplified embodiments will be achieved by introducing the scatter particles into the matrix material of the scattering layer 7. The scatter particles have a size of greater than or equal to 200 nm and less than or equal to 5000 nm and a refractive index which is different in comparison with the matrix material. For example, the scatter particles can have a higher refractive index than the matrix material. In particular, scatter particles which consist, e.g., of titanium oxide or zirconium oxide are suitable for this purpose. It is also possible for the scatter particles to have a lower refractive index than the matrix material. The scatter particles can consist, e.g., of silicon dioxide or can be formed as pores, e.g., as pores which are filled with air.

Furthermore, the scattering layers 7 of the illustrated exemplified embodiments can have additives present therein such as, e.g., UV-absorbent materials and/or materials having a thermal conductivity which is greater than the thermal conductivity of the matrix material. The additives can comprise in particular materials, as described above in the general part.

In addition to the illustrated exemplified embodiments of FIGS. 1A to 1D, an organic light-emitting device can also comprise at least two or more scattering layers which are arranged at the positions shown in FIGS. 1A to 1D.

Figure 2:
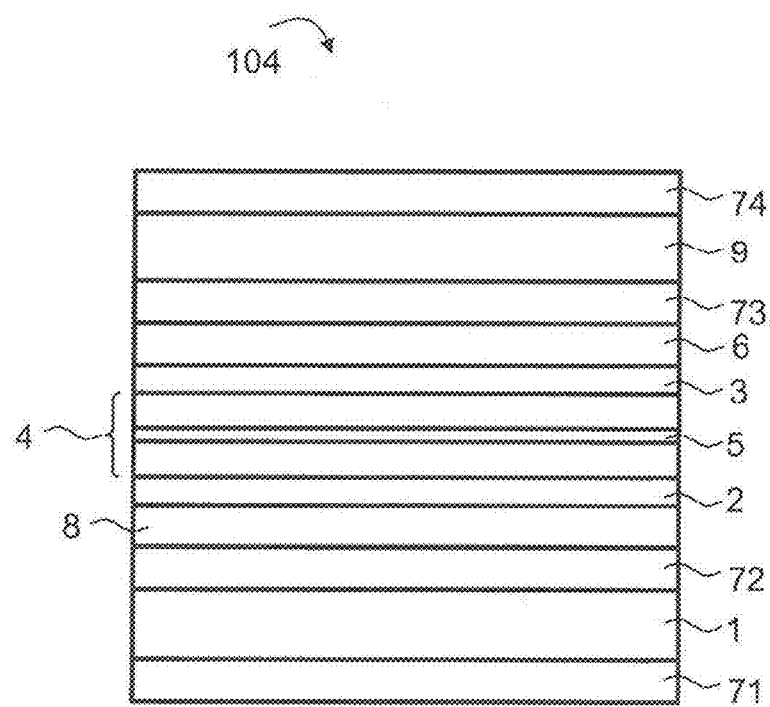
FIG. 2 shows a schematic view of an organic light-emitting device in accordance with a further exemplified embodiment.

FIG. 2 shows such an organic light-emitting device 104 which has more than one scattering layer and, purely by way of example, has four scattering layer 71, 72, 73, 74 which are arranged on the substrate side and on the side of the cover layer 9. The organic light-emitting device 104 thus corresponds to a combination of the exemplified embodiments of FIGS. 1A to 1D. In particular, in the case of the organic light-emitting device 104 both electrodes 2, 3 are formed in a transparent manner, so that the organic light-emitting device 104 is translucent and radiates in both directions, i.e., through the substrate 1 and through the cover layer 9.

Figure 3A:
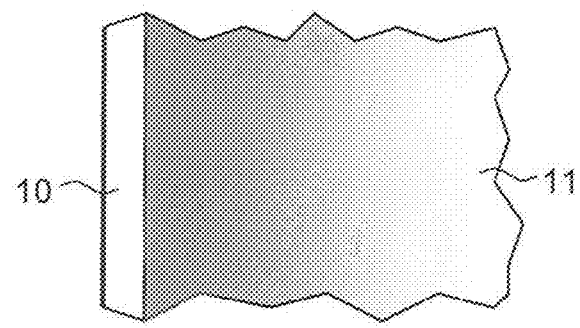
FIGS. 3A and 3B show schematic views of varying scatter particle concentrations of the scattering layer.

FIG. 3A shows an exemplified embodiment of an organic light-emitting device in a plan view of the active surface 11 which appears luminescent during operation of the device. In the case of the previously shown light-emitting devices 100 and 102 in accordance with FIGS. 1A and 1C, the active surface 11 is formed by the side of the scattering layer 7 facing away from the organic functional layer stack 4, and in the case of the light-emitting devices 101 and 103 the active surface is formed by the side of the substrate 1 (FIG. 1B) or cover layer 9 (FIG. 1D) facing away from the organic functional layer stack 4.

In order to contact at least one of the electrodes, a contact region 10 is provided next to the active surface 11. Since by reason of such a one-sided electrical contact the luminous density decreases with distance to the contact element 10 by reason of the transverse conduction resistance of the electrode materials, the scattering layer required for homogenization of the luminous density has a lateral variation of the scattering effect by virtue of a varying concentration of the scatter particles in the matrix material, which is indicated by the differently shaded region of the active surface 11. This kind of increase in the scattering effect ensures that in the regions which are further away from the contact region 10 more light can be coupled out which would otherwise be guided by wave guide effects in the layers of the device. In particular, the concentration of the scatter particles increases as the distance to the contact element 10 increases. Alternatively, the thickness of the scattering layer can also increase when the scatter particle concentration is constant or even when the scatter particle concentration varies.

Figure 3B:
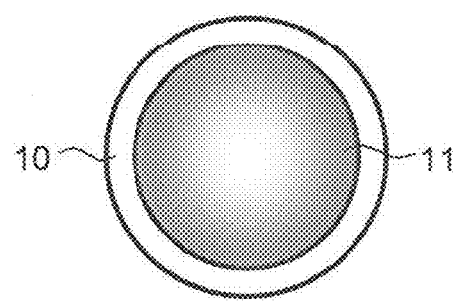

FIG. 3B shows a further exemplified embodiment for a circular organic light-emitting device, in which the contact region 10 laterally surrounds the active surface 11. The luminous density of the light radiated by the active surface 11 without an optical scattering layer thus decreases from the edge towards the center. The luminous density can be homogenized by means of a scattering layer having a radial concentration gradient of the scatter particles towards the center.

Figure 4A:
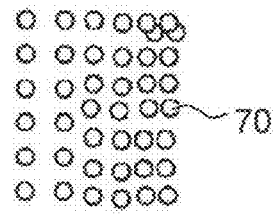
FIGS. 4A and 4B show schematic views of a method for producing a scattering effect gradient.
Figure 4B:
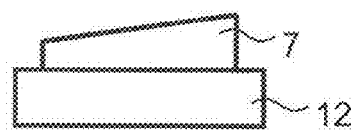

In order to produce scattering effect gradients, as shown in FIG. 4A in a plan view and in FIG. 4B in a sectional view, a varying density of individual points of the material 70 of the scattering layer can be applied on the corresponding element 12 of the organic light-emitting device, e.g., on the substrate or the cover layer. By means of a tempering step causing spreading of the individual regions of the material 70 of the scattering layer, it is possible to produce the varying scattering film thickness of the scattering layer 7 as shown in FIG. 4B.

Figure 5A:
FIGS. 5A to 5C show schematic views of a further method for producing scattering effect gradients in accordance with a further exemplified embodiment.
Figure 5B:
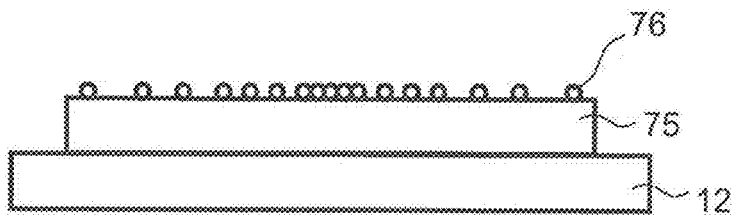
Figure 5C:
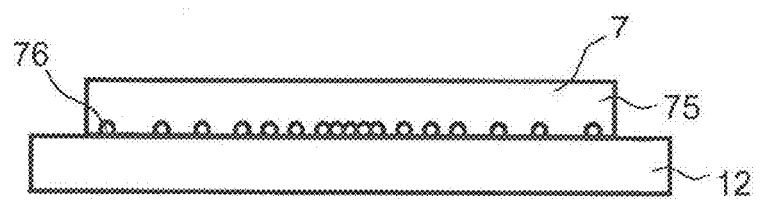

A further method for producing a scattering effect gradient is shown in FIGS. 5A to 5C. For this purpose, a matrix material 75 is uniformly applied, as shown in FIG. 5A, on an element 12 of the organic light-emitting device, e.g., on the substrate or the cover film. Scatter particles 76 are arranged on the matrix material 75, e.g., by spray-coating or printing, as shown in FIG. 5B, wherein the scatter particles 76 are arranged in a desired density and varying distribution on the matrix material 75. By sinking the scattering 76 into the matrix material 75, as shown in FIG. 5C, a laterally varying scattering effect—as described above—of the thus produced scattering layer 7 is achieved.

The invention is not limited by the description using the exemplified embodiments. Rather, the invention includes any new feature and any combination of features included in particular in any combination of features in the claims, even if this feature or this combination itself is not explicitly stated in the claims or exemplified embodiments.

What is claimed is:

1. An organic light-emitting device comprising:
   a substrate;
   a transparent electrode overlying the substrate;
   a further electrode overlying the substrate;
   an organic light-emitting layer between the transparent electrode and the further electrode;
   an optical scattering layer arranged on a side of the transparent electrode facing away from the organic light-emitting layer, wherein the optical scattering layer comprises a matrix material and scatter particles having a refractive index different from the matrix material; and
   a contact element, wherein at least one of the transparent electrode and the further electrode is electrically contacted by the contact element, and wherein the scatter particles have a concentration that increases as a distance from the contact element increases.

2. The device according to claim 1, wherein the optical scattering layer has a varying thickness.

3. The device according to claim 1, wherein the substrate is transparent, wherein the transparent electrode is arranged between the substrate and the light-emitting organic layer, and wherein the optical scattering layer is arranged between the transparent electrode and the substrate and/or on a side of the substrate facing away from the transparent electrode.

4. The device according to claim 1, further comprising a cover layer, wherein the transparent electrode, the further electrode and the organic light-emitting layer are arranged between the substrate and the cover layer.

5. The device according to claim 4, wherein the cover layer is transparent, wherein the transparent electrode is arranged between the cover layer and the light-emitting organic layer, and wherein at least one optical scattering layer is arranged between the transparent electrode and the cover layer and/or on a side of the cover layer facing away from the transparent electrode.

6. The device according to claim 1, wherein the further electrode is transparent and optical scattering layers are arranged on different sides of the organic light-emitting layer.

7. The device according to claim 1, wherein the matrix material comprises one or more of the following materials: polycarbonate, polyethylene naphthalate, polyethylene terephthalate, polyurethane, acrylate, polymethyl methacrylate and epoxide.

8. The device according to claim 1, wherein the matrix material comprises a sol-gel and/or an inorganic material having a refractive index of greater than 1.8.

9. The device according to claim 1, wherein the scatter particles have a size of greater than or equal to 200 nm and less than or equal to 5000 nm and wherein the scatter particles are formed by pores.

10. The device according to claim 1, wherein the scatter particles have a size of greater than or equal to 200 nm and less than or equal to 5000 nm and wherein the scatter particles comprise at least one of the following materials: aluminum oxide, titanium dioxide, zirconium dioxide, silicon dioxide.

11. The device according to claim 1, wherein the optical scattering layer comprises at least one additive that adapts the refractive index, is UV-absorbent and/or has a thermal conductivity that is greater than the thermal conductivity of the matrix material.

12. The device according to claim ii, wherein the additive is present in form of nanoparticles, which have a size of less than 50 nm.

13. The device according to claim ii, wherein the additive comprises one or more of the following materials: titanium dioxide, 2-hydroxybenzophenone, 2-hydroxyphenyl benzotriazole, salicylic acid ester, cinnamic acid ester derivative, resorcinol monobenzoate, oxalic acid anilide, and p-hydroxybenzoic acid ester.

14. The device according to claim ii, wherein the additive comprises one or more of the following materials: aluminum nitride, silicon carbide and magnesium oxide.

* * * * *

UNITED STATES PATENT AND TRADEMARK OFFICE
CERTIFICATE OF CORRECTION

PATENT NO. : 9,748,523 B2  
APPLICATION NO. : 15/096606  
DATED : August 29, 2017  
INVENTOR(S) : Daniel Steffen Setz Page 1 of 1

It is certified that error appears in the above-identified patent and that said Letters Patent is hereby corrected as shown below:

In the Claims

Column 14, Line 16, Claim 12, delete "claim ii" and insert --claim 11--.

Column 14, Line 19, Claim 13, delete "claim ii" and insert --claim 11--.

Column 14, Line 25, Claim 14, delete "claim ii" and insert --claim 11--.

Signed and Sealed this
Twenty-sixth Day of December, 2017

Joseph Matal
*Performing the Functions and Duties of the*
*Under Secretary of Commerce for Intellectual Property and*
*Director of the United States Patent and Trademark Office*